(12) United States Patent
House (10) Patent No.: US 11,791,788 B2
(45) Date of Patent: Oct. 17, 2023

(54) PARAMETRIC AMPLIFIER (71) Applicant: NEWSOUTH INNOVATIONS PTY LTD, Kensington (AU)

(72) Inventor: Matthew G. House, Sydney (AU)

(73) Assignee: NEWSOUTH INNOVATIONS PTY LTD, Kensington (AU)

( * ) Notice: Subject to any disclaimer, the term of this patent is extended or adjusted under 35 U.S.C. 154(b) by 392 days.

(21) Appl. No.: 16/487,071

(22) PCT Filed: Feb. 20, 2018

(86) PCT No.: PCT/AU2018/000024
§ 371 (c)(1),
(2) Date: Aug. 19, 2019

(87) PCT Pub. No.: WO2018/148784
PCT Pub. Date: Aug. 23, 2018

(65) Prior Publication Data
US 2021/0135643 A1     May 6, 2021

(30) Foreign Application Priority Data
Feb. 20, 2017    (AU) ................................ 2017900543

(51) Int. Cl.
*H03F 7/04*       (2006.01)
*B82Y 20/00*      (2011.01)

(52) U.S. Cl.
CPC ............... *H03F 7/04* (2013.01); *B82Y 20/00* (2013.01)

(58) Field of Classification Search
CPC ............ H03F 7/04; H03F 19/00; B82Y 20/00
See application file for complete search history.

(56) References Cited

U.S. PATENT DOCUMENTS

| | | | |
|---|---|---|---|
| 6,294,794 B1* | 9/2001 | Yoshimura | B82Y 10/00 257/14 |
| 6,323,504 B1* | 11/2001 | Shin | H01L 29/7888 257/E29.301 |
| 10,482,388 B1* | 11/2019 | Jock | G06N 10/00 |
| 10,929,769 B2* | 2/2021 | Pioro-Ladriere | H01L 31/035236 |
| 2002/0179897 A1* | 12/2002 | Eriksson | B82Y 10/00 257/14 |
| 2008/0017845 A1* | 1/2008 | Drndic | B82Y 30/00 257/E29.1 |

(Continued)

OTHER PUBLICATIONS

Nano Lett. 2019, 19, 8, 5628-5633 Publication Date:Jul. 24, 2019 (Year: 2019).*

(Continued)

*Primary Examiner* — Jarrett J Stark
(74) *Attorney, Agent, or Firm* — Fenwick & West LLP (57) ABSTRACT

The present disclosure relates to parametric amplifiers that can be used in the presence of a magnetic field. In particular the present disclosure relates to an integrated signal amplifier that comprises: a quantum dot; a first conductive electrode arranged in a manner such that tunnelling of electrons to the quantum dot is prevented; and a second conductive electrode arranged in a manner such tunnelling of electrons to the quantum dot is permitted. When an oscillating signal is applied across the first and second electrodes, the equivalent capacitance across the first and the second electrodes oscillates at the frequency of the oscillating signal.

20 Claims, 8 Drawing Sheets

(56) References Cited

U.S. PATENT DOCUMENTS

| | | | | |
|---|---|---|---|---|
| 2008/0142787 | A1* | 6/2008 | Loss | G06N 10/00 |
| | | | | 257/E29.071 |
| 2010/0085678 | A1* | 4/2010 | Jefferson | H01L 29/0673 |
| | | | | 257/14 |
| 2010/0142259 | A1* | 6/2010 | Drndic | H01L 21/0337 |
| | | | | 365/158 |
| 2011/0121895 | A1* | 5/2011 | Morello | G06N 10/00 |
| | | | | 257/E29.322 |
| 2012/0223291 | A1* | 9/2012 | Klem | H01L 51/422 |
| | | | | 977/734 |
| 2015/0279981 | A1* | 10/2015 | Eriksson | H01L 29/66977 |
| | | | | 257/14 |
| 2017/0206461 | A1* | 7/2017 | Friesen | G06F 15/82 |
| 2017/0317203 | A1* | 11/2017 | Petta | H01L 31/035209 |

OTHER PUBLICATIONS

J. I. Colless, A. C. Mahoney, J. M. Hornibrook, A. C. Doherty, H. Lu, A. C. Gossard, and D. J. Reilly Phys. Rev. Lett. 110, 046805—Published Jan. 25, 2013 (Year: 2013).*

P. Pakkiam, A.V. Timofeev, M.G. House, M.R. Hogg, T. Kobayashi, M. Koch, S. Rogge, and M.Y. Simmons Phys. Rev. X 8, 041032—Published Nov. 26, 2018 (Year: 2018).*

W. D. Oliver, F. Yamaguchi, and Y. Yamamoto Phys. Rev. Lett. 88, 037901—Published Jan. 3, 2002 (Year: 2002).*

N. Ares, F.J. Schupp, A. Mavalankar, G. Rogers, J. Griffiths, G.A.C. Jones, I. Farrer, D.A. Ritchie, C.G. Smith, A. Cottet, G.A.D. Briggs, and E.A. Laird Phys. Rev. Applied 5, 034011—Published Mar. 24, 2016 (Year: 2016).*

Bruhat, L.E. et al., "Cavity photons as a probe for charge relaxation resistance and photon emission in a quantum dot coupled to normal and superconducting continua," arXiv: 1605.04732, May 16, 2016, pp. 1-15.

European Patent Office, Extended European Search Report and Opinion, EP Patent Application No. 18754609.8, dated Nov. 5, 2020, ten pages.

Kibis, O.V. et al., "Light-matter coupling in nanostructures without an inversion center," Superlattices and Microstructures, vol. 47 Jul. 4, 2009, pp. 216-218.

Mendes, U.C. et al., "Cavity squeezing by a quantum conductor," New Journal of Physics, vol. 17, Nov. 3, 2015, pp. 1-12.

PCT International Search Report and Written Opinion, PCT/AU2018/000024, dated Apr. 17, 2018, 8 Pages.

C. Zhan et al., "Quantum Effects on the Capacitance of Graphene-Based Electrodes", The Journal of Physical Chemistry C published by the American Chemical Society, 1155 Sixteenth Street N.W., Washington, DC 20036, J. Phys. Chem. C, Just Accepted Manuscript; DOI: 10.1021/acs.jpcc.5b05930, Publication Date (Web): Sep. 8, 2015, pp. 1 of 19 to p. 19 of 19 whole document.

T. Akiyama et al., "Quantum-Dot Semiconductor Optical Amplifiers", vol. 95, No. 9, Sep. 2007, Proceedings of the IEEE, pp. 1757-1766 whole document.

* cited by examiner

802 - Applying a first signal with a first frequency and a first amplitude across a first and a second conductive electrodes disposed in proximity of at least one quantum dot; the first conductive electrode being arranged in a manner such that tunnelling of electrons to the at least one quantum dot is prevented; and the second conductive electrode being arranged in a manner such that tunnelling of electrons to the at least one quantum dot is permitted 804 - Applying a second signal with a second amplitude across the first and the second electrodes 806 - Measuring a third signal across the first and the second electrodes; the third signal having an amplitude comprised between the first and the second amplitude

FIGURE 8

PARAMETRIC AMPLIFIER

FIELD OF THE INVENTION

The present invention relates to parametric amplifiers suitable for use in an integrated circuit. In particular, the present invention relates to cryogenic parametric amplifiers that can be used in the presence of a magnetic field.

BACKGROUND OF THE INVENTION

Parametric amplification is a widely used technique in microwave engineering and optics. It relies on a nonlinear reactive element (capacitor or inductor for microwaves, nonlinear refraction in optics) to mix two AC signals. Power can be transferred from one mode (the "pump") to another (the "signal"), resulting in amplification of the signal. An advantage of this type of amplification is that in purely reactive elements there is no dissipation, which means minimal added noise.

Parametric amplifiers using reversed-bias semiconductor diodes, for example, have been shown to be capable of very low noise performance in the microwave region. However, even in this type of amplifiers, the thermal noise generated in the semiconductor spreading resistance is unavoidable.

Some applications, such as reading signals generated by qubits in a quantum processor, require parametric amplifiers which provide low noise performance in the quantum processor operating conditions and are compatible with the quantum processor architecture.

For example, parametric amplification by Josephson junction devices is used in quantum computing architectures based on Josephson junction superconductive qubits. Josephson junctions behave like highly nonlinear inductors. Parametric amplifiers based on Josephson junctions are extremely sensitive to magnetic fields and unsuitable for applications where magnetic fields are required.

SUMMARY OF THE INVENTION

Embodiments of the invention are related to a signal amplifier, a method for amplifying a signal and an apparatus for amplifying a readout signal from a quantum bit. The amplifier is realised using a quantum dot and two or more conductive electrodes. Embodiments of the amplifier are suitable for integration in a quantum computing circuit that operates in presence of a magnetic field.

In accordance with a first aspect, the present invention provides a signal amplifier comprising:
- a quantum dot;
- a first conductive electrode arranged in a manner such that tunnelling of electrons to the quantum dot is prevented; and
- a second conductive electrode arranged in a manner such that tunnelling of electrons to the quantum dot is permitted;
- wherein, when an oscillating signal is applied across the first and second electrodes, the equivalent capacitance across the first and the second electrodes oscillates at the frequency of the oscillating signal.

In some embodiments, the quantum dot is embedded in a semiconductor material.

In some embodiments, the quantum dot is configured so that the capacitance between the quantum dot and the first electrode is larger than the capacitance between the quantum dot and the second electrode. The quantum dot may be configured so that there is a high ratio between the capacitance between the quantum dot and the first electrode and the capacitance between the quantum dot and the second electrode. For example, the quantum dot may have a shape that allows optimising the capacitance ratio. For instance, the portion of the quantum dot exposed to the first electrode may be larger than the portion of the quantum dot exposed to the second electrode.

The first or the second electrodes may be disposed on a surface of the semiconductor and the quantum dot may be embedded into the semiconductor at a distance from the interface between the semiconductor and the electrodes.

Alternatively, both the electrodes and the quantum dot may be embedded in the semiconductor lattice. However, the electrodes and the dot may be disposed on different planes of the lattice.

In some embodiments, the first electrode is disposed on a surface of the semiconductor or embedded into the semiconductor at a first plane and the quantum dot and the second electrode are embedded into the semiconductor at a second plane.

In embodiments, the first electrode is configured to, at least partially, wrap-around the quantum dot, to maximise the capacitance between the quantum dot and the first electrode. At least a portion of the first electrode may be configured as a semi-circle or a semi-sphere around the quantum dot.

In some embodiments, the quantum dot is configured so that that the capacitance ratio is between 2 and 20 or, preferably, between 6 and 15.

In embodiments, the quantum dot and the second electrode are configured so that an electron tunnelling time between the second electrode and the quantum dot is shorter than a period of the oscillating signal.

In embodiments, the second electrode is configured to have a reduced thickness in proximity of the quantum dot to minimise the capacitance between the quantum dot and the second electrode.

In some embodiments, two oscillating signals may be applied to the first and second electrodes: a first oscillating signal, with a first frequency and a first amplitude, and a second oscillating signal, with a second frequency and a second amplitude.

The first and second electrodes may be arranged, in respect to the quantum dot, in a manner such that, when the first and second oscillating signals are applied to the first and second electrodes, a third signal is generated between the first and the second electrodes; the third signal having an amplitude comprised between the first and the second amplitude.

In some instances, the first frequency is similar to the second frequency and the amplitude of the third signal is proportional to a difference in phase between the first and the second signals. In some other cases, the difference between the first and the second frequencies is larger, and the third signal has a frequency which is proportional to the sum or the difference of the first and second frequencies.

In embodiments the semiconductor material is silicon and the quantum dot is formed by phosphorus.

In accordance with a second aspect, the present invention provides an apparatus for amplifying a readout signal from a quantum bit, the apparatus comprising a signal amplifier in accordance with the first aspect; wherein the second conductive electrode is arranged to receive a readout signal from the quantum bit and an amplified version of the readout signal is generated across the first and the second electrodes.

In some embodiments, the apparatus comprises at least one phosphorus atom embedded in silicon and a plurality of conductive electrodes arranged in proximity of the phosphorous atom.

In embodiments, the first frequency is similar to a frequency of the readout signal and the amplitude of the amplified version of the readout signal is proportional to a difference in phase between the first signal and the readout signal.

In accordance with a third aspect, the present invention provides a method for amplifying a signal comprising the steps of:

applying a first signal with a first frequency and a first amplitude across a first and a second conductive electrodes disposed in proximity of at least one quantum dot; the first conductive electrode being arranged in a manner such that tunnelling of electrons to the at least one quantum dot is prevented; and the second conductive electrode being arranged in a manner such that tunnelling of electrons to the at least one quantum dot is permitted; the first signal being such that the equivalent capacitance across the first and the second electrodes oscillates at the first frequency;

applying a second signal with a second amplitude across the first and the second electrodes; and measuring a third signal across the first and the second electrodes; the third signal having an amplitude comprised between the first and the second amplitude.

In accordance with a fourth aspect, the present invention provides a method for reading out a signal from a quantum bit comprising at least one phosphorus atom embedded in silicon and a plurality of conductive electrodes arranged in proximity of the at least one phosphorous atom to operate the quantum bit, the method comprising:

applying a first signal with a first frequency and a first amplitude across a first and a second conductive electrodes disposed in proximity of at least one quantum dot in a semiconductor material; the first conductive electrode being arranged in a manner such that tunnelling of electrons to the at least one quantum dot is prevented; and the second conductive electrode being arranged in a manner such that tunnelling of electrons to the at least one quantum dot is permitted; the second conductive electrode being arranged to receive a readout signal from the quantum bit; the first signal being such that, the equivalent capacitance across the first and the second electrode oscillates at the first frequency; and measuring an amplified version of the readout signal across the first and the second electrodes; the amplified version of the readout signal having an amplitude comprised between the first amplitude and the amplitude of the readout signal.

Advantageous embodiments provide a parametric amplifier that can be used in presence of a magnetic field and is compatible with silicon quantum computing architectures. For example, embodiments of the invention can be integrated in architectures that use phosphorous spin qubits in silicon, or quantum bits based on the creation of a quantum dot by attracting charge near a silicon/silicon dioxide interface.

Embodiments, provide an amplifier that is lossless, in the coherent regime $$\left(\hbar\gamma \gg kT \text{ and } \frac{\gamma}{2\pi} \gg T_2^{*-1}\right)$$

and has a high input/output impedance, therefore voltage is the primary variable.

More generally, embodiments provide an integrated mixer that can be used as a parametric amplifier in applications that require a magnetic field.

BRIEF DESCRIPTION OF THE DRAWINGS

Features and advantages of the present invention will become apparent from the following description of embodiments thereof, by way of example only, with reference to the accompanying drawings, in which.

DETAILED DESCRIPTION OF EMBODIMENTS

In the following description a signal mixer and amplifier, a method for amplifying a signal and an apparatus for amplifying a readout signal from a quantum bit in accordance with embodiments are described.

In some embodiments, the amplifier is realised using a quantum dot and two or more conductive electrodes to facilitate integration in a quantum computing circuit that operates in presence of a magnetic field. The quantum dot is tuned to its charge degeneracy point to create a nonlinear capacitor behaviour. This nonlinearity is used to realise signal mixing, in particular parametric amplification that is compatible with semiconductor circuits. In particular, embodiments of the parametric amplifier described can be used with spin qubit devices.

Referring to FIG. 1, there is shown a schematic side view of four configurations of the amplifier comprising the quantum dot and respective electrodes. In the example of FIG. 1, the amplifier is realised in silicon and the quantum dot and electrodes can be formed by embedding phosphorus atoms in silicon. The phosphorus atoms may be embedded in the silicon material by using the lithographic capability of a scanning tunnelling microscope. In some instances, the amplifier may have more than one quantum dots.

Figure 1A:
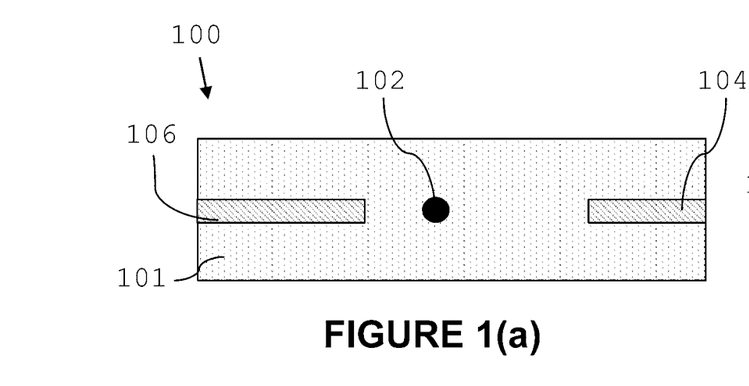
FIG. 1 shows schematic side views (a to c) and a top view (d) of four configurations of the amplifier comprising the quantum dot and respective electrodes.

In FIG. 1(a), the integrated signal amplifier 100 has a quantum dot 102, a first conductive electrode 104 and a second conductive electrode 106. The electrodes and the quantum dots are embedded in a crystalline silicon structure 101. Electrode 104 is arranged so that tunnelling of electrons to the quantum dot is prevented. The second conductive electrode 106, instead, is arranged in a manner such that tunnelling of electrons to the quantum dot is permitted.

Quantum dot 102 is positioned in close proximity of the second electrode (source electrode) 106 to facilitate electron tunnelling between the quantum dot 102 and the second electrode 106. Whereas, the distance between the quantum dot 102 and the first electrode (gate electrode) 104 is such that tunnelling between the quantum dot 102 and the first electrode 104 is prevented.

When an oscillating signal is applied across the first 104 and second 106 electrodes, the equivalent capacitance across the first 104 and the second 106 electrodes oscillates at the frequency of the oscillating signal.

In device 100 both the first 104 and second 106 electrodes are located within the semiconductor material 101 approximately in the same plane of the quantum dot 102.

In the alternative embodiments shown in FIG. 1, the electrodes 104, 106 are located on different planes in the semiconductor material 101 or on the surface of the semiconductor material 101.

Figure 1B:
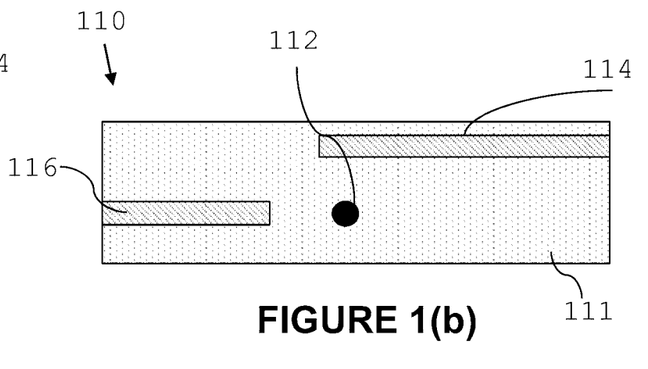

In FIG. 1(b), device 110 has the first electrode 114 embedded in the semiconductor structure 111 and located in a first plane of the semiconductor structure 111. The second electrode 116, instead, is positioned on the same plane of the quantum dot 112, below the plane of the first electrode 114. This configuration enables a greater capacitance between the first electrode 114 and the quantum dot 112.

Figure 1C:
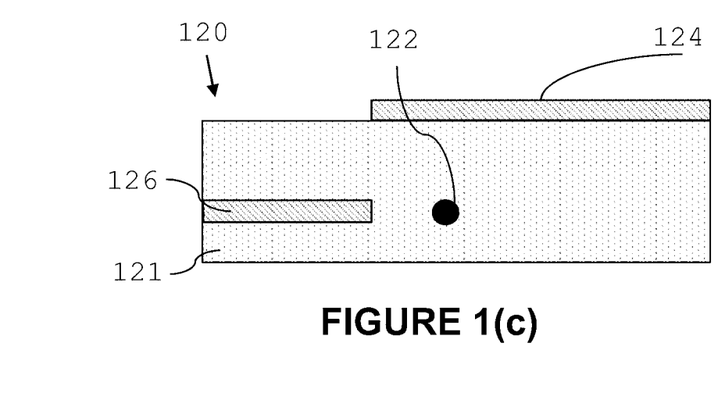

In FIG. 1(c), the first electrode 124 of device 120 is located on the surface of the semiconductor structure 121. The quantum dot 122 is buried into the semiconductor 121 in the same plane as the second electrode 126. The configuration in device 120 can be fabricated using more conventional electronic manufacturing techniques such as metal-oxide-semiconductor technology.

Figure 1D:
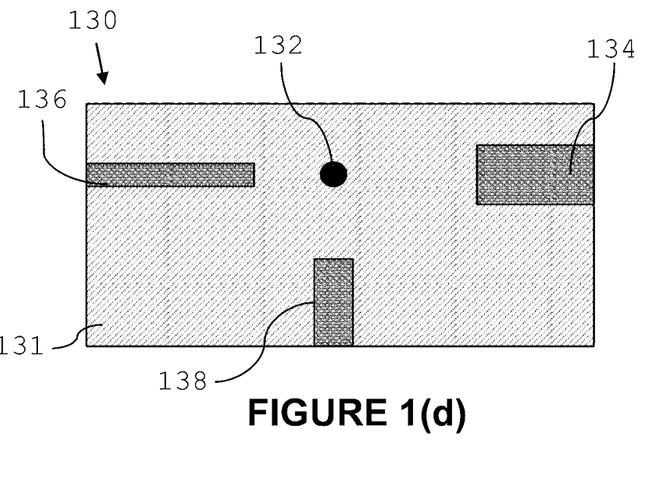

In FIG. 1(d), there is shown a top view of an alternative configuration of the amplifier 130 with a third electrode 138 (DC Gate). The third electrode 138 allows to apply a DC bias voltage to the quantum dot 132. Without this extra electrode, a bias tee may need to be connected to the device in order to input the dc bias voltage.

The third electrode 138 has a tuning function. It allows to tune the structure at the most pronounced point of curvature of the capacitance-voltage characteristics. By applying a DC tuning voltage to the third electrode 138, the variation of capacitance related to the AC signal applied can be maximised.

Device 130 is designed to be incorporated, with minor modifications, into a spin qubit device, for amplifying RF signals generated, for example, by dispersive readout. Further details of this incorporation are provided in this document with reference to FIG. 7. Device 130 conveniently provides signal gain within the device. Furthermore, degenerate amplification allows for lossless amplification of a dispersive readout signal. Negative resistance up-conversion allows the dispersive measurement to operate at a much lower frequency, while providing the gain benefit of the higher output frequency.

Although the properties and advantages of amplifiers have been known in the art for many years, the Inventors have surprisingly found that the structures shown in FIG. 1 can be used as parametric amplifiers that are able to perform in the presence of a magnetic field.

The tunnelling between the second electrode and the quantum dot, in the coherent regime is adiabatic and lossless:

$$\hbar\gamma \gg kT \text{ and } \frac{\gamma}{2\pi} \gg T_2^{*-1}$$

$\Gamma$ is the tunnelling ratio and $T_2^{*-1}$ is the dephasing time.

The equivalent capacitance can be expressed as:

$$C(V) = \frac{\alpha^2 e^2}{\pi} \cdot \frac{\hbar\gamma}{(\hbar\gamma)^2 + (\alpha eV)^2}.$$

To maximize the nonlinearity of the quantum dot, the geometric capacitance between the gate electrode and the quantum dot can be maximized and all other geometric capacitances minimized by, for example, designing an asymmetric quantum dot and matching neighbouring electrodes. α is the capacitance ratio between the quantum dot/second electrode capacitance and the quantum dot/first electrode capacitance.

In an embodiment, the quantum dots are formed by using Scanning Tunnelling Microscope (STM) techniques. The silicon encapsulation can be achieved by growing silicon material by molecular beam epitaxy (MBE).

Advantages of these quantum dots include the absence of confinement gates or 2DEG required; limited stray capacitance to ground and the simple two-terminal device.

Using STM techniques, the shape of the quantum dot can be engineered to achieve a maximum capacitive coupling to the gate, and minimum capacitance between dot and source.

In alternative embodiments, corner quantum dots in Fin-FET or nanowire devices can be used. These provide a good capacitive coupling to the gate.

Figure 2A:
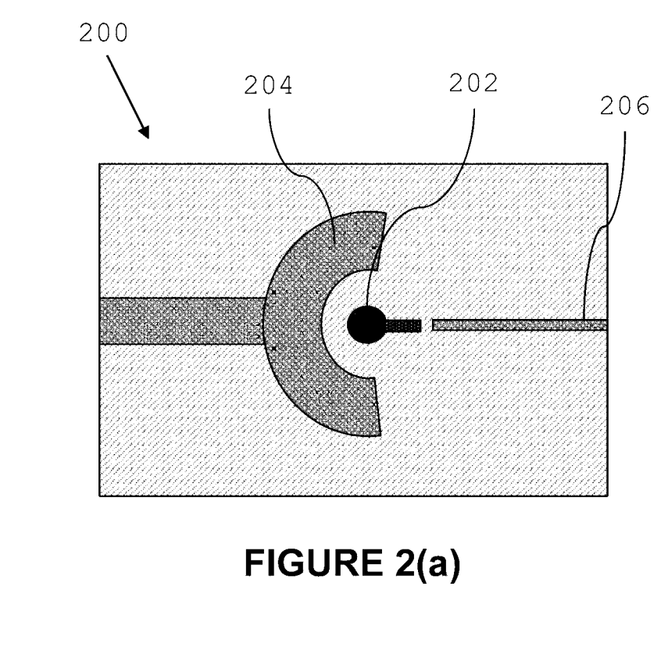
FIG. 2 shows a schematic top view representation of the amplifier with a wrap-around electrode configuration (a) and an STM image of the actual device (b)

Referring now to FIG. 2(a), there is shown a top view of a schematic representation of the amplifier 200 with a first electrode 204 configured to wrap-around the quantum dot 202. The wrap-around configuration increases the geometric capacitance between the first electrode 204 and the quantum dot 202.

The second electrode 206 is closer to the quantum dot 202 and is configured to only have a narrow section directly exposed to the quantum dot 202 to minimise the geometric capacitance between the electrode 206 and the quantum dot 202.

Importantly, in device 200, the quantum dot 202 has an asymmetric shape that facilitates tunnelling of electrons to and from electrode 206 and allows maximising the capacitance towards electrode 204 while preventing electron tunnelling towards electrode 204. The distance between quantum dot 202 and electrode 206 is designed to enable an average electron tunnelling frequency much greater than the amplifier's intended operating frequency.

Figure 2B:
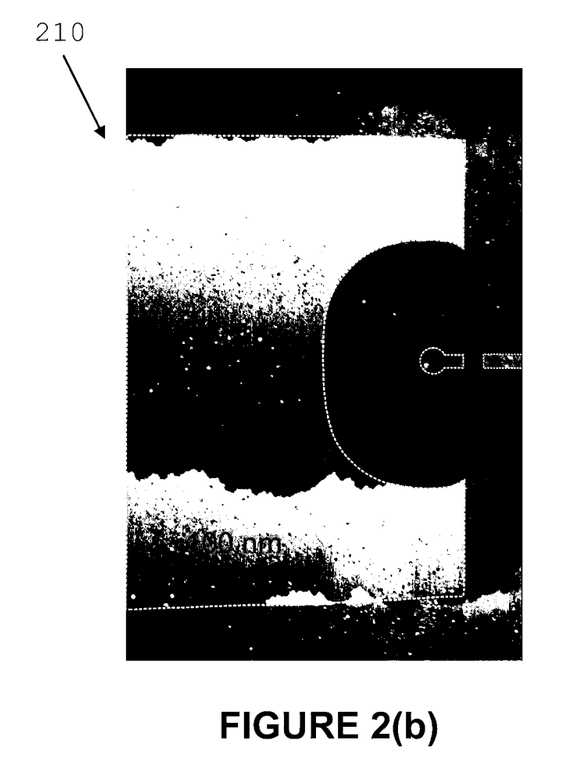

FIG. 2(b) shows an STM image of device 200. The lighter coloured areas outlined in white have been lithographically patterned such that they will be phosphorus doped and metallic in the final device, while the undoped areas of silicon remain insulating at cryogenic temperatures. The first electrode is approximately 300 nm wide and designed to wrap-around the quantum dot while maintaining a distance of approximately 70 nm from the quantum dot. The quantum dot has been shaped with more weight to the left to increase the capacitance between it and the first electrode 204. The distance between the quantum dot and the second electrode 206, approximately 10 nm, has been chosen to enable a tunnelling rate for electrons to and from the quantum dot greater than 10 GHz. The measured capacitance ratio for this device is about 2.

Figure 3:
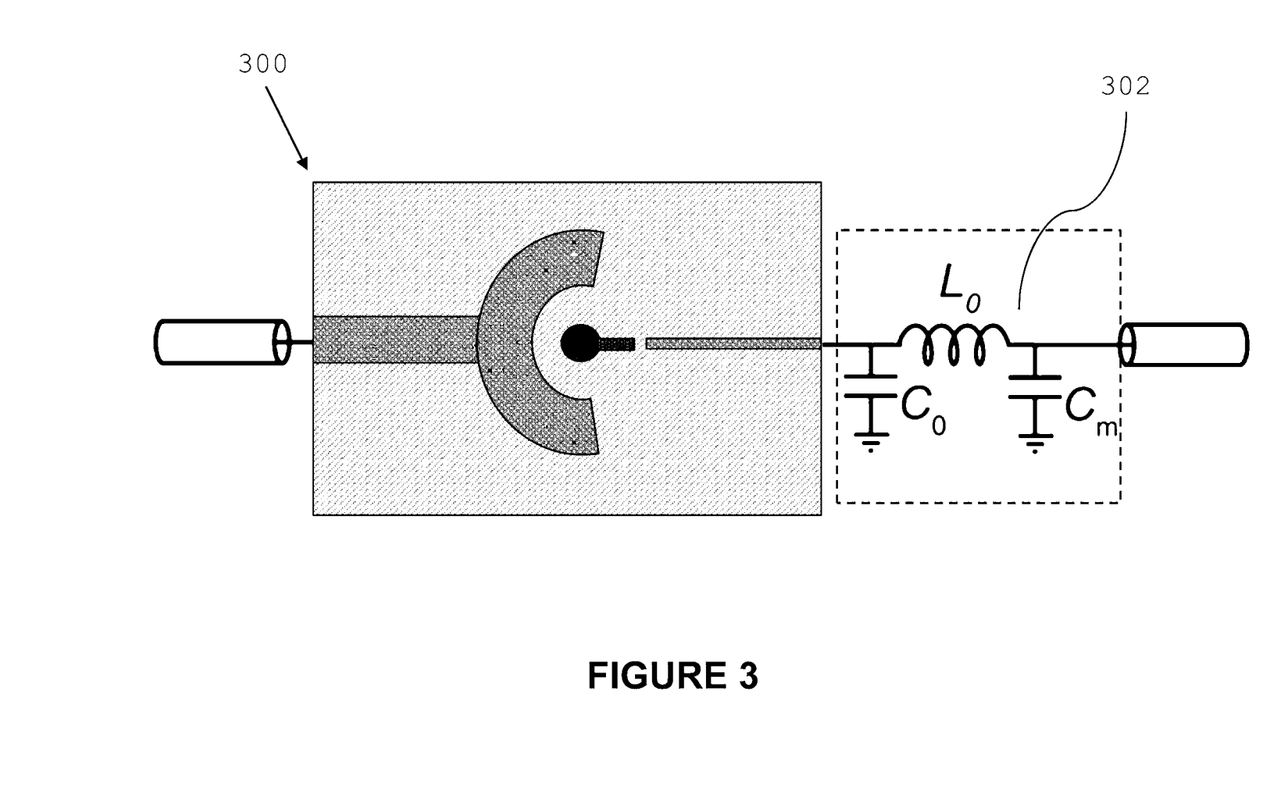
FIG. 3 shows the amplifier of FIG. 2 in a resonant circuit.

Referring now to FIG. 3 there is shown a schematic configuration 300 of amplifier 200 incorporated into a resonant circuit in accordance with embodiments.

The resonant circuit in FIG. 3 allows enhancing the voltage/current relationship (impedance match) of the quantum dot to an external circuit. The embodiment in FIG. 3 shows a lumped element LC resonator 302, however, this configuration can be implemented with other types of impedance matching elements like a stripline resonator or cavity.

Figure 4A:
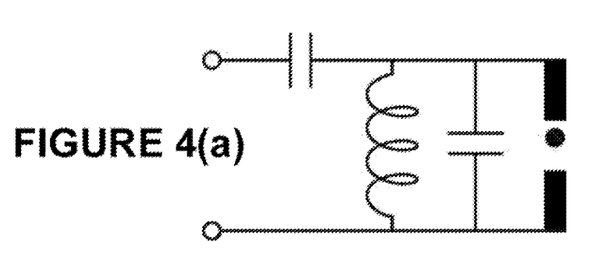
FIG. 4 shows schematic configurations of the amplifier.
Figure 4B:
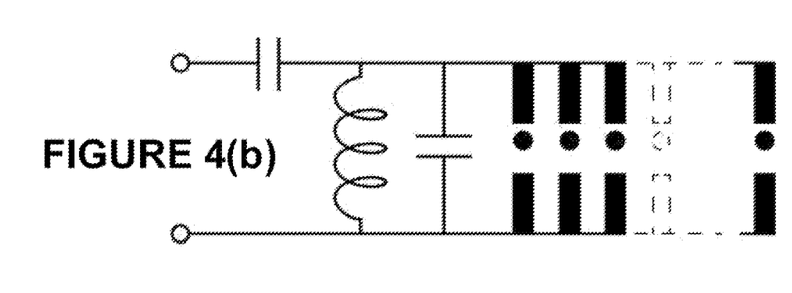
Figure 4C:
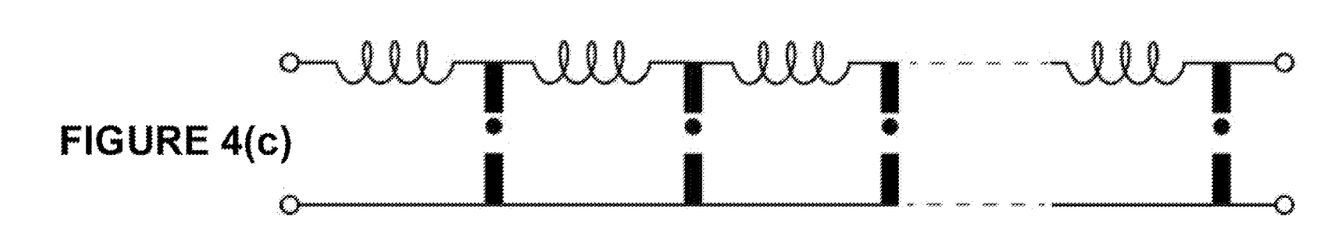
Figure 4D:
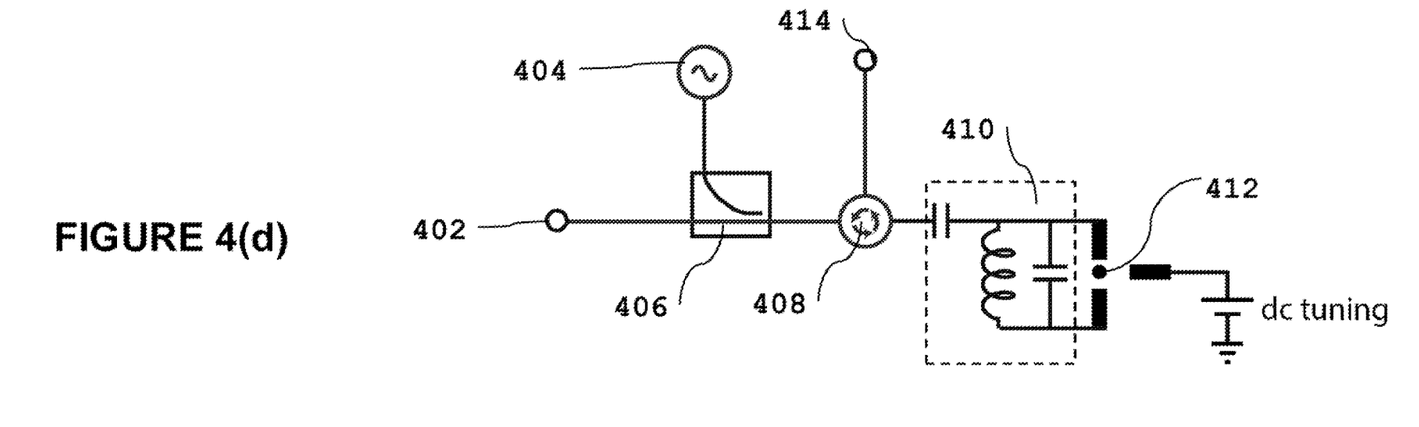

Referring now to FIG. 4, there are shown schematic configurations of the amplifier with an alternative resonant circuit configuration, FIG. 4(a), with multiple quantum dots in parallel, FIG. 4(b), in a travelling wave amplifier configuration, FIG. 4(c) and in a circuit designed to provide separate ports for the input, pump, and output signals FIG. 4(d).

In FIGS. 4(a) and 4(b), multiple quantum dots are used in parallel. This configuration allows enhancing the nonlinearity and increasing the dynamic range (maximum output power) of the amplifier.

FIG. 4(c) shows an alternative configuration of the amplifier with several quantum dots in parallel in a transmission line in accordance with an embodiment. In this configuration, the amplifier does not require the resonant circuit and allows for larger bandwidth than the resonant circuit version.

FIG. 4(d) shows a schematic of the amplifier including off-chip components needed in some cases to amplify a signal. At the left is the input port 402 for the signal to be amplified (for example, coming from a qubit readout device), which is combined with a pump driving signal 404 using a directional coupler 406. The signal passes through a circulator 408 to the resonator 410 and quantum dot(s), where the mixing occurs. The pump 404, input signal 402, and amplified output signal are reflected back from the resonant circuit 410, and then routed by the circulator 408 towards the output port 414 of the amplifier. In alternative embodiments, the pump signal 402 is introduced via the dc gate (138 in FIG. 1).

The components in FIG. 4(d) are shown as off-chip components. However, in some embodiments, some or all of these components are fabricated 'on-chip' to facilitate integration of the amplifier with one or more qubits.

Figure 5:
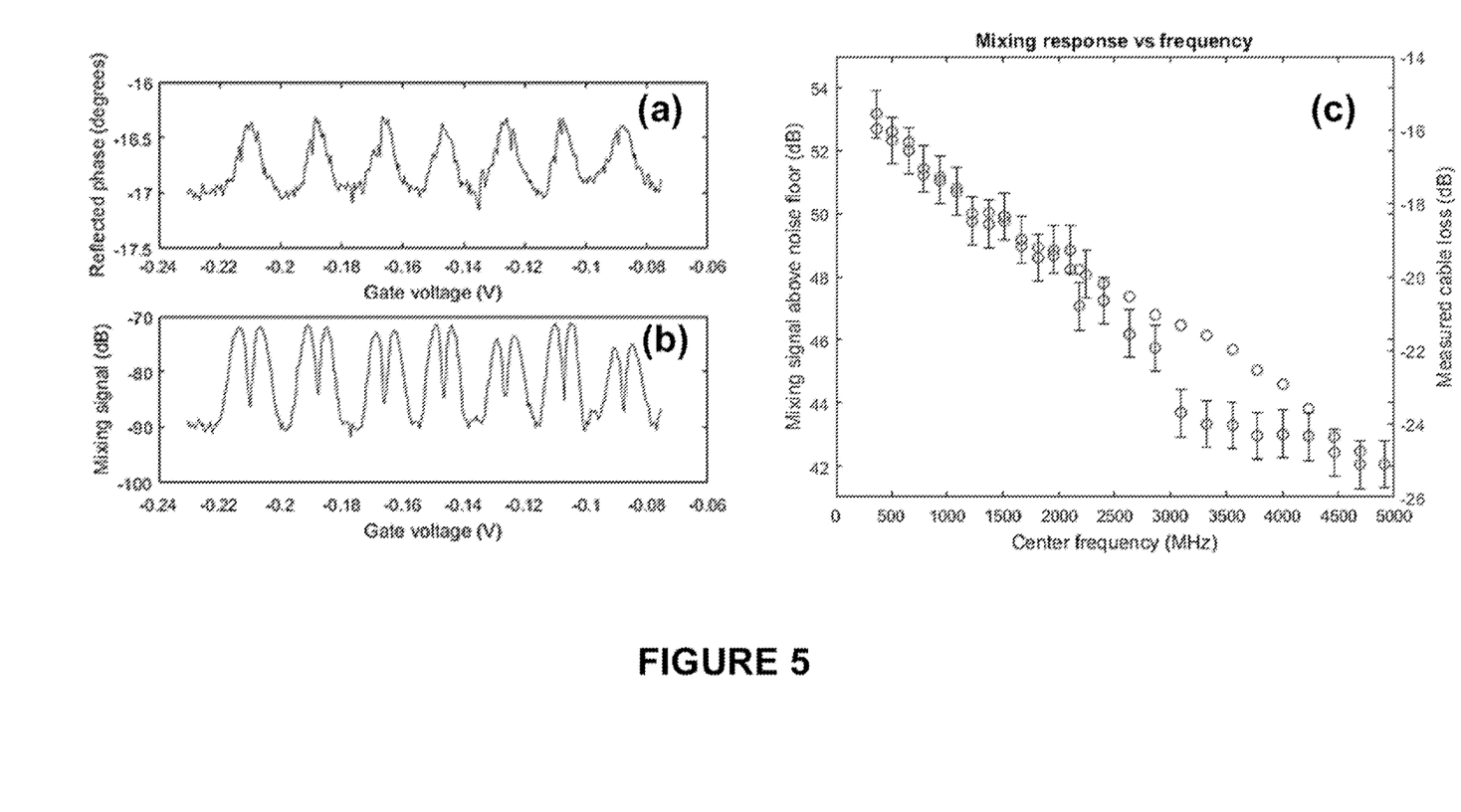
FIG. 5 shows a plot of the measured phase response of the prototype device (proportional to the capacitance) as a function of the voltage across the electrodes (a); output mixed signal as a function of the voltage applied across the electrodes (b) when two noncommensurate signals are applied across the electrodes (c)

FIG. 5 shows a plot of the measured phase response of the prototype device (proportional to the capacitance) as a function of the voltage across the electrodes, FIG. 5(a); output mixed signal as a function of the voltage applied across the electrodes when two noncommensurate signals are applied across the electrodes, FIG. 5(b), and the intensity of the mixed signal and losses as a function of the center frequency, FIG. 5(c).

Referring now to FIG. 5(a), there is shown a measurement of the phase of a reflected 228 MHz signal from the prototype device as a function of the dc voltage applied across the electrodes. The phase is proportional to the capacitance. The changing capacitance as a function of voltage can be exploited to mix two rf signals. An example of such mixing is shown in FIG. 5(b), which shows the measured output of the prototype device measured at 228 MHz when two distinct signals, separated in frequency by 228 MHz. The measured signals is the part of the two input signals which has been mixed to the difference frequency (228 MHz) by the nonlinear capacitance of the quantum dot.

The mixing works over a wide range of microwave frequencies, as shown in FIG. 5(c), which shows the magnitude of the mixed output signal as a function of the center frequency of the two input signals. The output magnitude matches well with the trend expected from losses in the signal cables, up to at least 3 GHz.

Figure 6:
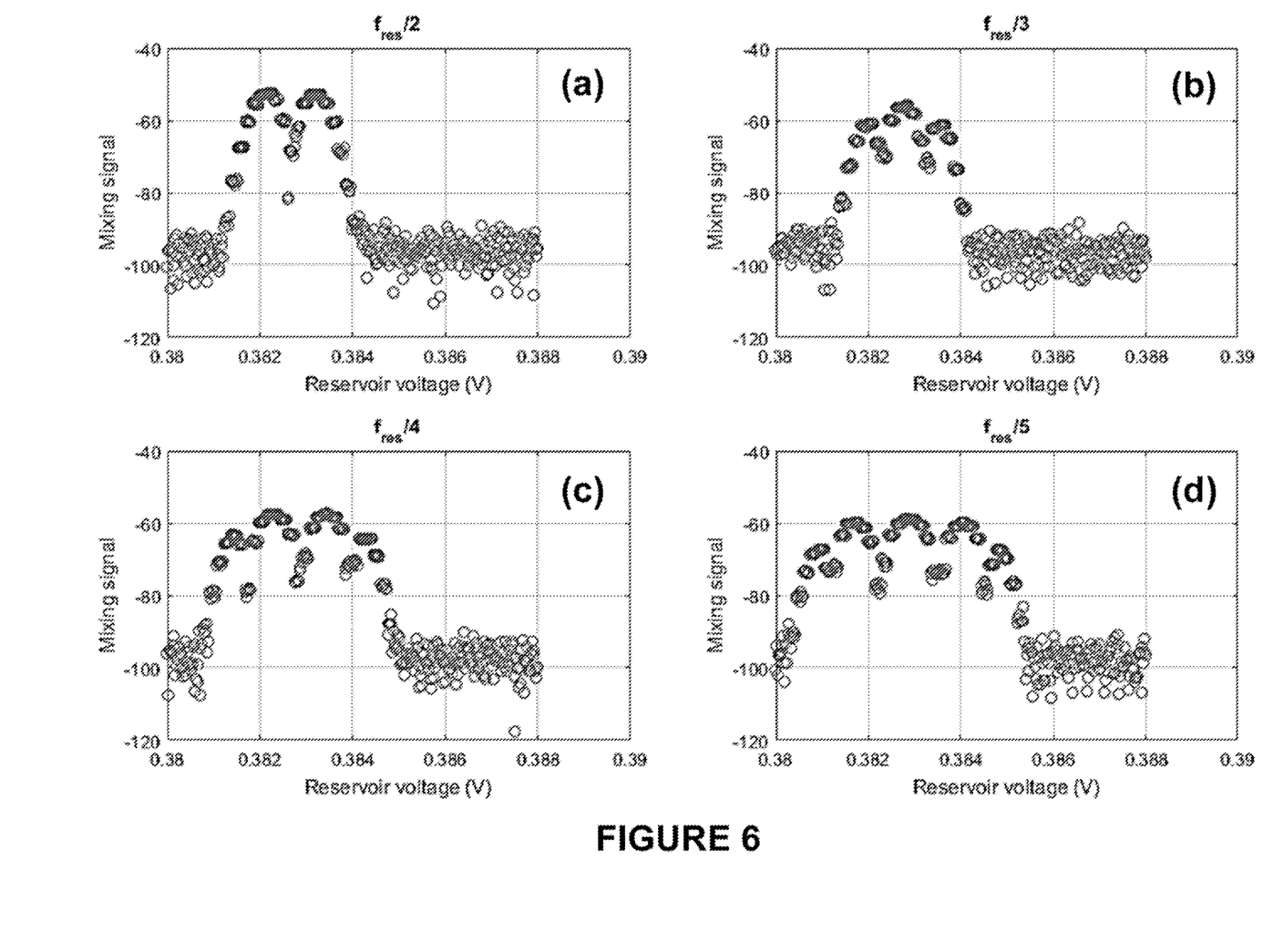
FIG. 6 shows the intensity of an output signal measured from the prototype device at frequency f_res as a function of the DC bias voltage across the device.

Referring now to FIG. 6, there is shown a demonstration of the use of the prototype device as a frequency multiplier. In particular, FIG. 6 shows the intensity of an output signal measured from the prototype device at frequency f_res as a function of the DC bias voltage across the device. The input signal frequency is f_res/2 (a); f_res/3 (b); f_res/4 (c) f_res/5 (d). These results demonstrate the use of the prototype device as a mixer and frequency multiplier.

The output signal at 228 MHz is plotted against the DC voltage across the electrodes, when the input signal is (a) 114 MHz; (b) 76 MHz; (c) 57 MHz; (d) 45.6 MHz. The each input frequency is multiplied up to the output frequency by the mixing property of the quantum dot.

Figure 7:
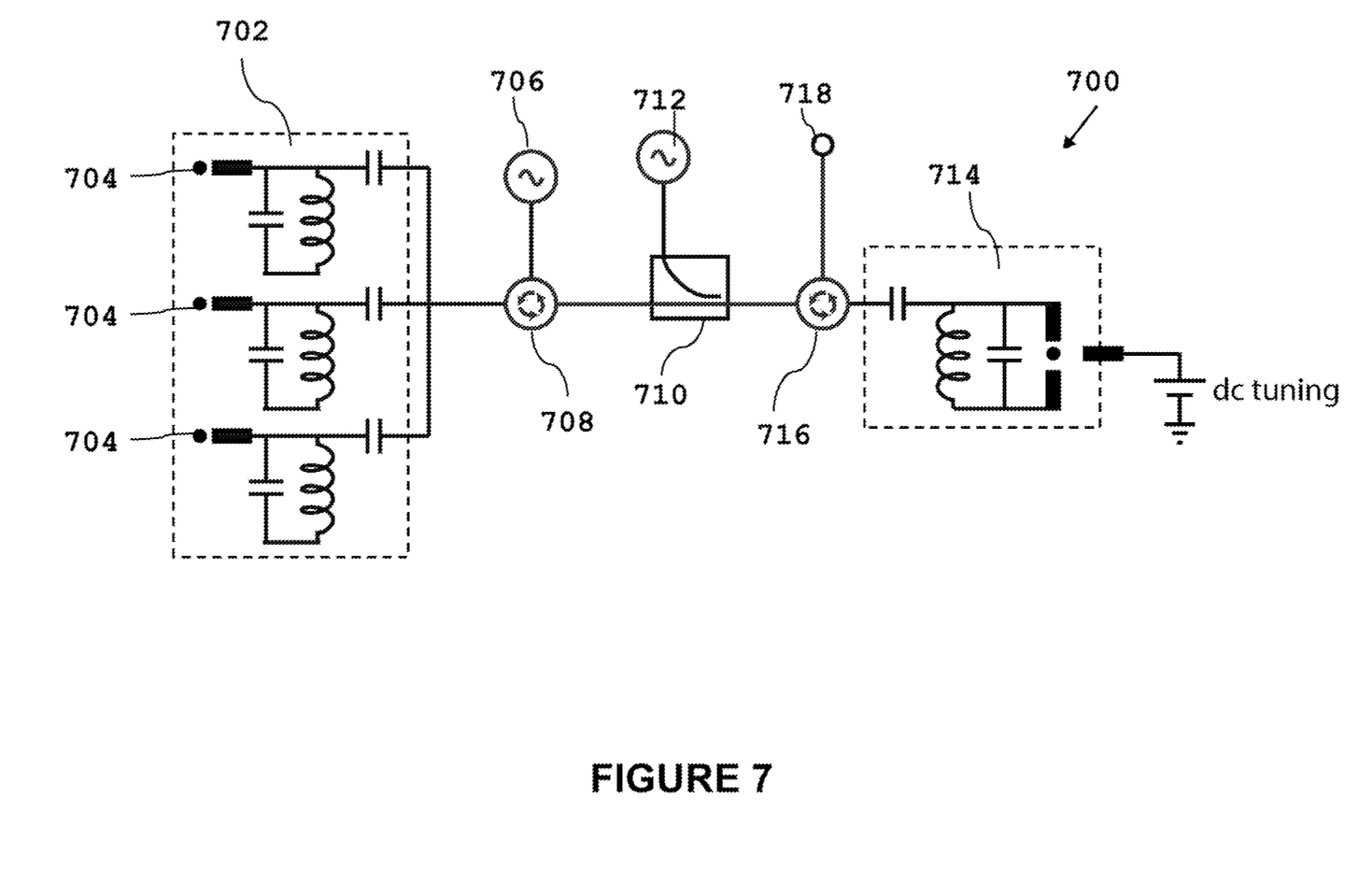
FIG. 7 shows a schematic representation of the amplifier integrated with silicon based qubits to perform readout.

Referring now to FIG. 7, there is shown a schematic of a quantum dot parametric amplifier 700 integrated with a qubit device 702 that comprises several qubits 704. A small qubit probe signal 706 is introduced to address one or more of qubits 704 by dispersive readout. Each qubit 704 is embedded in a resonant circuit. The state of the addressed qubit 704 is encoded in the phase of the signal reflected from the resonant circuit, which is routed towards the amplifier 714 at right by a circulator 708. A directional coupler 710 introduces the pump signal 712. The amplified signal is reflected from the amplifier 714 and routed by a circulator 716 towards an output port 718 for further amplification and measurement.

Figure 8:
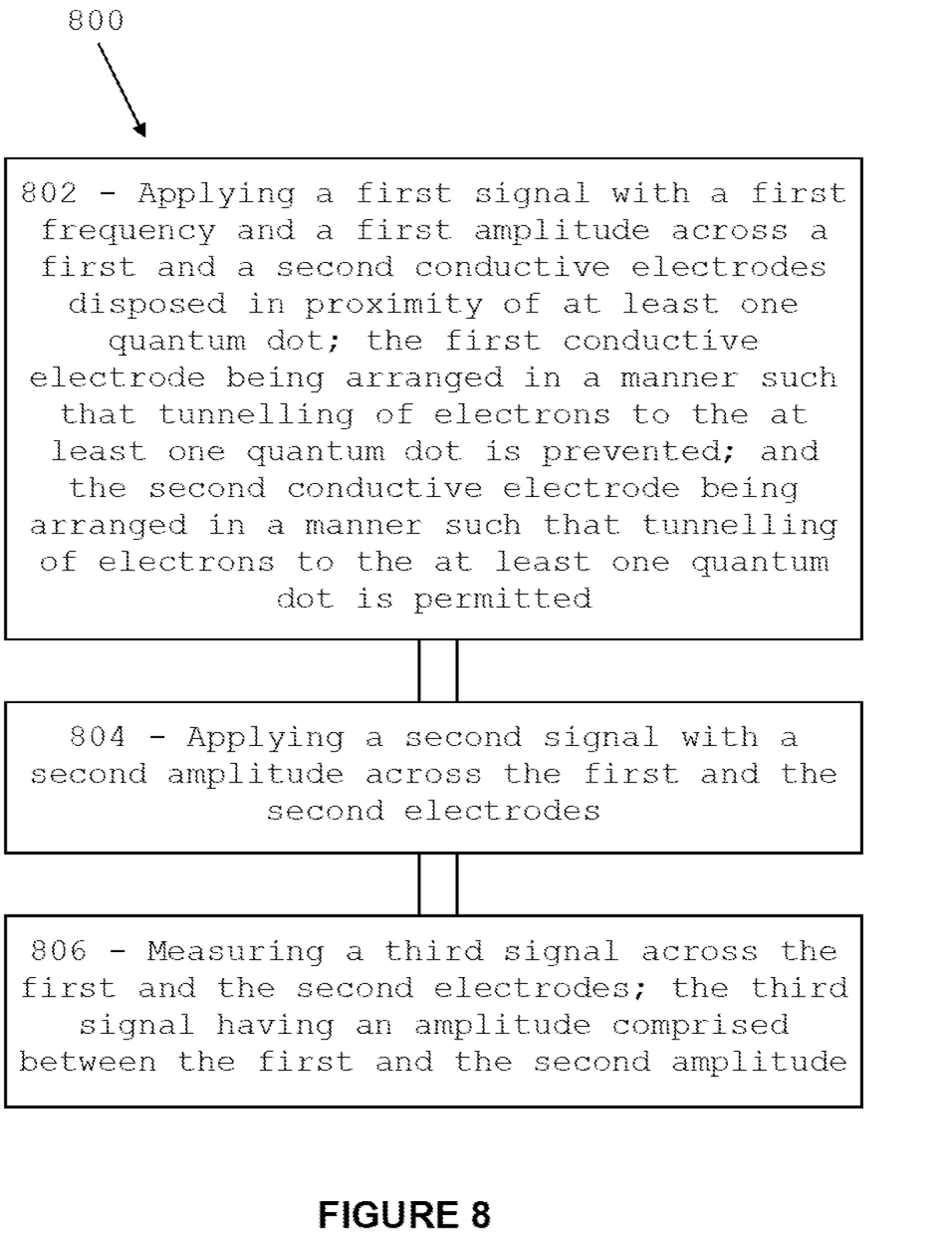
FIG. 8 is a flow diagram presenting a list of steps to operate an amplifier in accordance with embodiments.

Referring now to FIG. 8 there is shown a flow diagram 800 with a list of steps for operating or for amplifying a signal in accordance with embodiments.

At step 802, a first signal with a first frequency and a first amplitude is applied across a first and a second conductive electrodes disposed in proximity of at least one quantum dot. Tunnelling of electrons to the at least one quantum dot is prevented. The second conductive electrode is arranged in a manner such that tunnelling of electrons to the at least one quantum dot is permitted. The first signal is such that the equivalent capacitance across the first and the second electrodes oscillates at the first frequency.

At step 804, a second signal with a second amplitude is applied across the first and the second electrodes and, at step 806, a third signal is measured across the first and the second electrodes. The third signal has an amplitude comprised between the first and the second amplitude.

Applications of the parametric amplifier disclosed herein in accordance with embodiments include: oscillators; mixers; RF switches; frequency doublers and others.

There may be other applications which would benefit from having a small, highly nonlinear component which can be fabricated on-chip with spin qubit devices.

The term "comprising" (and its grammatical variations) as used herein are used in the inclusive sense of "having" or "including" and not in the sense of "consisting only of".

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The invention claimed is:

1. An integrated signal amplifier comprising:
   a quantum dot;
   a first conductive electrode configured to prevent tunnelling of electrons to the quantum dot; and
   a second conductive electrode configured to permit tunnelling of electrons to the quantum dot;
   wherein, the first and second electrodes are configured to have an equivalent capacitance across them oscillating at a frequency when an oscillating signal is applied across the first and second electrodes, wherein the frequency is a frequency of the oscillating signal.

2. The amplifier of claim 1, wherein the quantum dot is embedded in a semiconductor material.

3. The amplifier of claim 1, wherein the quantum dot is configured so that a capacitance between the quantum dot and the first electrode is larger than a capacitance between the quantum dot and the second electrode.

4. The amplifier of claim 3, wherein the quantum dot is configured so that a high capacitance ratio between (i) the capacitance between the quantum dot and the first electrode and (ii) the capacitance between the quantum dot and the second electrode.

5. The amplifier of claim 4, wherein the first electrode is configured to, at least partially, wrap-around the quantum dot to increase the capacitance between the quantum dot and the first electrode.

6. The amplifier of claim 5, wherein at least a portion of the first electrode is configured as a semi-circle or a semi-sphere around the quantum dot.

7. The amplifier of claim 4, wherein the quantum dot is configured so that that the capacitance ratio is larger than 2 and smaller than 20.

8. The amplifier of claim 1, wherein the quantum dot and the second electrode are configured so that an electron tunnelling time between the second electrode and the quantum dot is shorter than a period of the oscillating signals.

9. The amplifier of claim 2, wherein the first electrode is disposed on a surface of the semiconductor and the quantum dot is embedded into the semiconductor at a distance from an interface between the semiconductor and the electrodes.

10. The amplifier of claim 2, wherein both the electrodes and the quantum dot are embedded in the semiconductor lattice.

11. The amplifier of claim 10, wherein the electrodes are disposed on a first plane within the semiconductor and the quantum dot is disposed on a second plane within the semiconductor.

12. The amplifier of claim 2, wherein the first electrode is disposed on a surface of the semiconductor or embedded into the semiconductor at a first plane and the quantum dot and the second electrode are embedded into the semiconductor at a second plane.

13. The amplifier of claim 1, wherein the second electrode is configured to have a reduced thickness in proximity of the quantum dot to reduce the capacitance between the quantum dot and the second electrode.

14. The amplifier of claim 1, wherein two oscillating signals are applied to the first and second electrodes: a first oscillating signal, with a first frequency and a first amplitude, and a second oscillating signal, with a second frequency and a second amplitude; and the first and second electrodes are arranged, in respect to the quantum dot, in a manner such that, when the first and second oscillating signals are applied to the first and second electrodes, a third signal is generated between the first and the second electrodes; the third signal having an amplitude comprised between the first and the second amplitude.

15. The amplifier of claim 14, wherein the amplitude of the third signal is proportional to a difference in phase between the first and the second signals.

16. The amplifier of claim 14, wherein the third signal has a frequency which is proportional to a sum or a difference of the first and second frequencies.

17. The amplifier of claim 2, wherein the semiconductor material is silicon and the quantum dot is formed by phosphorus.

18. An apparatus for amplifying a readout signal from a quantum bit, the apparatus comprising:
a signal amplifier comprising:
a quantum dot;
a first conductive electrode configured to prevent tunnelling of electrons to the quantum dot, and
a second conductive electrode configured to permit tunnelling of electrons to the quantum dot,
wherein, the first and second electrodes are configured to have an equivalent capacitance across them oscillating at a frequency when an oscillating signal is applied across the first and second electrodes, wherein the frequency is a frequency of the oscillating signal,
wherein the second conductive electrode is arranged to receive a readout signal from the quantum bit and an amplified version of the readout signal is generated across the first and the second electrodes.

19. The apparatus of claim 18, further comprising at least one phosphorus atom embedded in silicon and a plurality of conductive electrodes arranged in proximity of the at least one phosphorous atom.

20. The amplifier of claim 1, wherein the quantum dot is positioned closer to the second conductive electrode than the first conductive electrode.

* * * * *

UNITED STATES PATENT AND TRADEMARK OFFICE
CERTIFICATE OF CORRECTION

| | |
|---|---|
| PATENT NO. | : 11,791,788 B2 |
| APPLICATION NO. | : 16/487071 |
| DATED | : October 17, 2023 |
| INVENTOR(S) | : Matthew G. House |

It is certified that error appears in the above-identified patent and that said Letters Patent is hereby corrected as shown below:

In the Claims

In Column 9, in Claim 7, Line 22, delete "that that" and insert -- that --, therefor.

In Column 10, in Claim 18, Line 27, delete "dot," and insert -- dot; --, therefor.

Signed and Sealed this
First Day of October, 2024

Katherine Kelly Vidal
*Director of the United States Patent and Trademark Office*